United States Patent [19]

Kitajima

[11] Patent Number: 4,998,823
[45] Date of Patent: Mar. 12, 1991

[54] TWO-DIMENSIONAL POSITION DETECTING METHOD AND APPARATUS

[75] Inventor: Hironobu Kitajima, Yokohama, Japan

[73] Assignee: Fujitsu Limited, Kawasaki, Japan

[21] Appl. No.: 405,293

[22] Filed: Sep. 11, 1989

[30] Foreign Application Priority Data

Sep. 12, 1988 [JP] Japan .............................. 63-227759

[51] Int. Cl.$^5$ ............................................... G01B 9/02
[52] U.S. Cl. .................................... 356/356; 356/363
[58] Field of Search .............................. 356/356, 363

[56] References Cited

U.S. PATENT DOCUMENTS 4,600,309 7/1986 Fay ................... 356/356 X
4,815,854 3/1989 Tanaka et al. ............ 356/356

FOREIGN PATENT DOCUMENTS 71603 1/1988 Japan .

Primary Examiner—Davis L. Willis
Assistant Examiner—Matthew W. Koren
Attorney, Agent, or Firm—Staas & Halsey

[57] ABSTRACT

A two-dimensional position detecting method detects a two-dimensional position of an object which has a diffraction grating provided thereon, and this diffraction grating comprises a first grating portion which extends in a first direction and a second grating portion which extends in a second direction which is perpendicular to the first direction. The two-dimensional position detecting method scans the first grating portion of the diffraction grating in the second direction by a coherent light and detects by a photosensor an mth order spectrum which is generated by a diffraction of the coherent light caused by the first grating portion, where m is an integer, and scans the second grating portion of the diffraction grating in the first direction by the coherent light and detects by the photosensor a zero order spectrum which is generated by a diffraction of the coherent light caused by the second grating portion, to thereby detect the two-dimensional position at an intersection of the first and second grating portions of the diffraction grating.

18 Claims, 7 Drawing Sheets

TWO-DIMENSIONAL POSITION DETECTING METHOD AND APPARATUS

BACKGROUND OF THE INVENTION

The present invention generally relates to two-dimensional position detecting methods and apparatuses, and more particularly to a two-dimensional position detecting method and apparatus suited for detecting a two-dimensional position when positioning a semiconductor wafer, a mask and the like.

Recently, due to the high integration density of semiconductor integrated circuits, there is a demand to increase the fineness of patterns. As a result, the semiconductor wafer and the mask must be positioned with a high accuracy, and it is necessary to detect two-dimensional positions of the semiconductor wafer and the mask with a high accuracy.

FIG. 1A is a diagram for explaining a conventional one-dimensional position detecting method. A coherent light CL scans a diffraction grating 10 in a direction Y, where the diffraction grating 10 comprises gratings which extend in a direction X. A diffracted light DL which is generated with a predetermined angle to the coherent light CL is detected by a photosensor 11. FIG. 1B shows an output signal of the photosensor 11 relative to the scan position of the coherent light CL along the direction Y. The position of the diffraction grating 10 in the direction Y can be detected with a high accuracy from a peak position $y_0$ where the output signal of the photosensor 11 becomes a maximum.

A description will now be given of the operating principle of a transmission type diffraction grating. As shown in FIG. 2A, a transmission type diffraction grating comprises openings 12 which are arranged periodically. The effects the opening 12 has on the amplitude and phase of the light are different from those of a periphery of the opening 12. The diffraction grating is located at a hatched portion on an XY-plane of an XYZ coordinate system shown in FIG. 2B. In FIG. 2A, l and s respectively denote the vertical and horizontal lengths of the opening 12, and d denotes the period of the openings 12 (or gratings). $\xi$-axis and $\eta$-axis respectively coincide with the X-axis and the Y-axis. It is assumed that the light originates from a point $Q(x_0, y_0, z_0)$ and the light received via the diffraction grating is monitored at a point $P(x, y, z)$. $R_0$ denotes a distance between an origin O and the point Q, and R denotes a distance between the origin O and the point P.

When there are N openings 12, a center $(\xi_n, \eta_n)$ of each opening 12 can be obtained from the following set of formulas (1), where $n=0, 1, \ldots, N-1$.

$$\left. \begin{array}{l} \xi_n = nd \\ \eta_n = 0 \end{array} \right\} \quad (1)$$

When the diffraction in the Fraunhofer region is considered by assuming that the distances $R_0$ and R are sufficiently large compared to the size of the grating which is irradiated with the light, a light wave U at the point P can be obtained from the following formula (2), where $k=2\pi/\lambda$, $\lambda$ denotes the wavelength of light, $p=\alpha-\alpha_0$, $q=\beta-\beta_0$, $\alpha_0=-x_0/R_0$, $\alpha=x/R$, $\beta_0=-y_0/R_0$, $\beta=y/R$, and C denotes a constant.

$$U(p,q) = C \sum_{n=0}^{N-1} \int_{-l/2}^{l/2} \int_{-s/2}^{s/2} e^{ik[(\xi_n+\xi')p+(\eta_n+\eta')q]} d\xi' d\eta' \quad (2)$$

$$= \left[ \sum_{n=0}^{N-1} e^{-ik(p\xi_n+q\eta_n)} \right] \cdot$$

$$\left[ C \int_{-l/2}^{l/2} \int_{-s/2}^{s/2} e^{-ik(p\xi'+q\eta')} d\xi' d\eta' \right]$$

The light waves U(p, q) and $U_0$(p, q) can thus be described as follows by using the formulas (1) and (2).

$$U(p,q) = \sum_{n=0}^{N} e^{-ikpnd} \cdot U_0(p,q)$$

$$= [(1 - e^{-iNkpd})/(1 - e^{-ikpd})] \cdot U_0(p,q)$$

$$U_0(p,q) = C \int_{-l/2}^{l/2} \int_{-s/2}^{s/2} e^{-ik(p\xi'+q\eta')} d\xi' d\eta'$$

$$= 4C[\sin(kps/2)/(kps/2)] \cdot [\sin(kql/2)/(kql/2)]$$

Accordingly, the following formula (3) can be obtained.

$$U(p,q) = (1 - e^{-iNkpd})/(1 - e^{-kpd}) \cdot 4C \cdot \quad (3)$$
$$[\sin(kps/2)/(kps/2)] \cdot [\sin(kql/2)/(kql/2)]$$

In addition, a light intensity J(p, q) can be described by the following formula (4), where $J_0 = |C|^2 s^2 l^2$.

$$J(p,q) = |U(p,q)|^2 \quad (4)$$

$$= J_0 \cdot [\sin(Nkpd/2)/\sin(kpd/2)]^2$$

$$[\sin(kps/2)/(kps/2)]^2$$

$$[\sin(kql/2)/(kql/2)]^2$$

From the formula (4), it is found that the diffracted light is generated in the direction $kpd/2 = m\pi$ ($m=0, \pm 1, \pm 2, \ldots$), that is, in the direction $\alpha - \alpha_0 = m\lambda/d$. The light which corresponds to each m is referred to as an mth order spectrum.

FIG. 3 generally shows an essential part of an example of a conventional one-dimensional position detecting apparatus. A laser light emitted from a laser tube 20 is reflected by a mirror 21 and is irradiated on a reflection type diffraction grating 22 which extends in the direction X. A $-1$st order spectrum generated by the diffraction grating 22 is reflected by the mirror 21 and is received by a photosensor 23 which is provided in a vicinity of the laser tube 20. An angle $\theta_m$ which is formed between a mirror surface 21a of the mirror 21 and the Z-axis is set so that a zero order spectrum does not reach the photosensor 23 as a noise. In FIG. 3, the diffraction grating 21 is scanned in the direction Y which is perpendicular to the paper so as to detect the position along the direction Y.

The conventional one-dimensional position detecting apparatus simply detects the one-dimensional position of an object. Hence, a pair of such one-dimensional position detecting apparatuses must be used in order to detect a two-dimensional position of the object. But in this case, there is a problem in that the accuracy of the position detection becomes poor due to an error in the relative arrangement of the two one-dimensional position detecting apparatuses. In addition, there are problems in that the diffraction grating which is detected by one one-dimensional position detecting apparatus must be separated by a certain distance from the diffraction grating which is detected by the other one-dimensional position detecting apparatus, and each one-dimensional position detecting apparatus alone cannot determine a two-dimensional position of one point.

SUMMARY OF THE INVENTION

Accordingly, it is a general object of the present invention to provide novel and useful two-dimensional position detecting method and apparatus in which the problems described above are eliminated.

Another and more specific object of the present invention is to provide a two-dimensional position detecting method for detecting a two-dimensional position of an object which has a diffraction grating provided thereon, where the diffraction grating comprises a first grating portion which extends in a first direction and a second grating portion which extends in a second direction which is perpendicular to the first direction, which two-dimensional position detecting method comprises the steps of scanning the first grating portion of the diffraction grating in the second direction by a coherent light, detecting by a photosensor an mth order spectrum which is generated by a diffraction of the coherent light caused by the first grating portion, where m is an integer, scanning the second grating portion of the diffraction grating in the first direction by the coherent light, and detecting by the photosensor a zero order spectrum which is generated by a diffraction of the coherent light caused by the second grating portion, thereby detecting the two-dimensional position at an intersection of the first and second grating portions of the diffraction grating. Accoridng to the two-dimensional position detecting method of the present invention, it is only necessary to use a single light source for generating the coherent light, a single optical system for converging the coherent light on the object, and a single photosensor for detecting the diffracted light. Hence, an accurate two-dimensional position detection can be made with a simple arrangement.

Still another object of the present invention is to provide a two-dimensional position detecting apparatus for detecting a two-dimensional position of an object which has a diffraction grating provided thereon, where the diffraction grating comprises a first grating portion which extends in a first direction and a second grating portion which extends in a second direction which is perpendicular to the first direction, which two-dimensional position detecting apparatus comprises a single light source for emitting a coherent light, converging means for converging the coherent light on the object, scanning means for generating a relative movement between the coherent light and the object in the first and second directions so as to scan the first grating portion of the diffraction grating in the second direction by the coherent light and scan the second grating portion of the diffraction grating in the first direction by the coherent light, and a single photosensor for detecting an mth order spectrum which is generated by a diffraction of the coherent light caused by the first grating portion during the scan in the second direction and for detecting a zero order spectrum which is generated by a diffraction of the coherent light caused by the second grating portion during the scan in the first direction, where m is an integer, to thereby detect the two-dimensional position at an intersection of the first and second grating portions of the diffraction grating. According to the two-dimensional position detecting apparatus of the present invention, an accurate two-dimensional position detection can be made with a simple arrangement because it is only necessary to provide a single light source for generating the coherent light, a single optical system for converging the coherent light on the object, and a single photosensor for detecting the diffracted light.

Other objects and further features of the present invention will be apparent from the following detailed description when read in conjunction with the accompanying drawings.

DESCRIPTION OF THE PREFERRED EMBODIMENTS

Figure 1A:
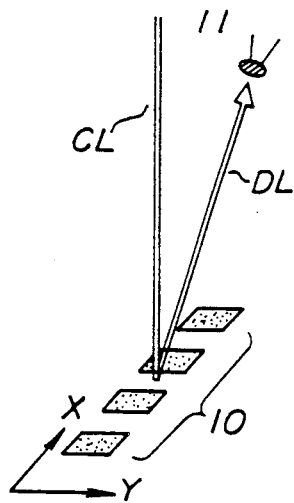
FIG. 1A is a diagram for explaining an example of a conventional one-dimensional position detecting method.
Figure 1B:
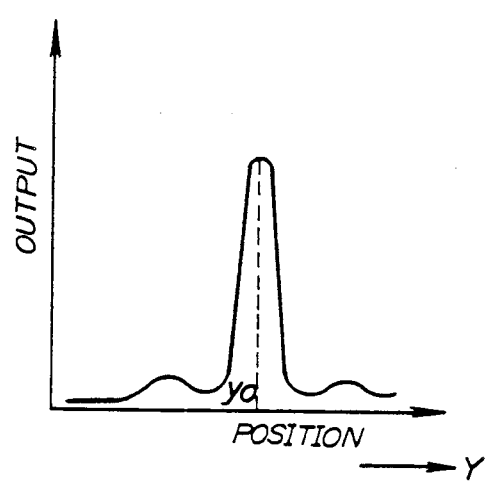
FIG. 1B shows an output of a photosensor relative to a scan position of a light in FIG. 1A.
Figure 2A:
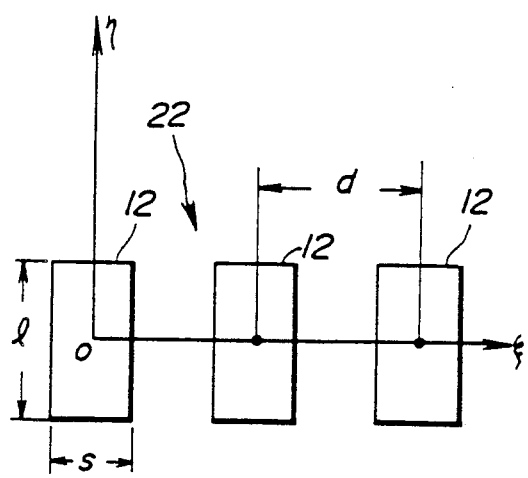
FIG. 2A shows an example of a diffraction grating.
Figure 2B:
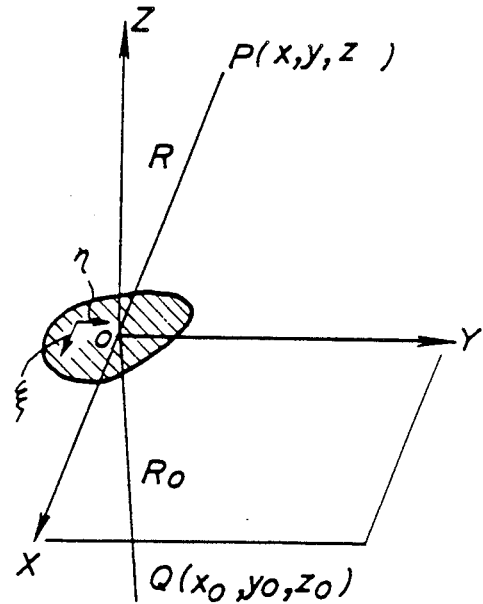
FIG. 2B shows a coordinate system for explaining an arrangement of the diffraction grating shown in FIG. 2A.
Figure 3:
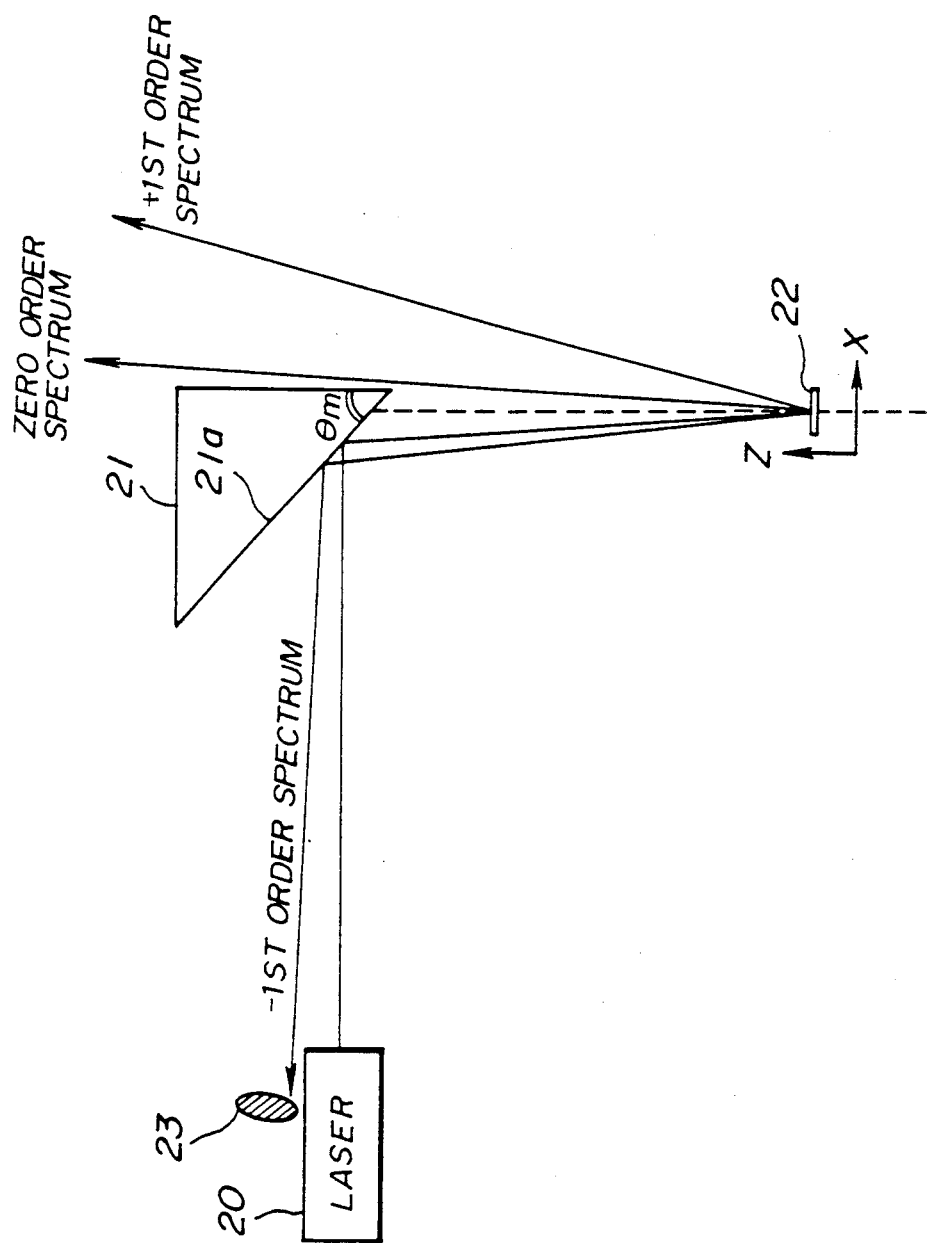
FIG. 3 generally shows an essential part of an example of a conventional one-dimensional position detecting apparatus.
Figure 4A:
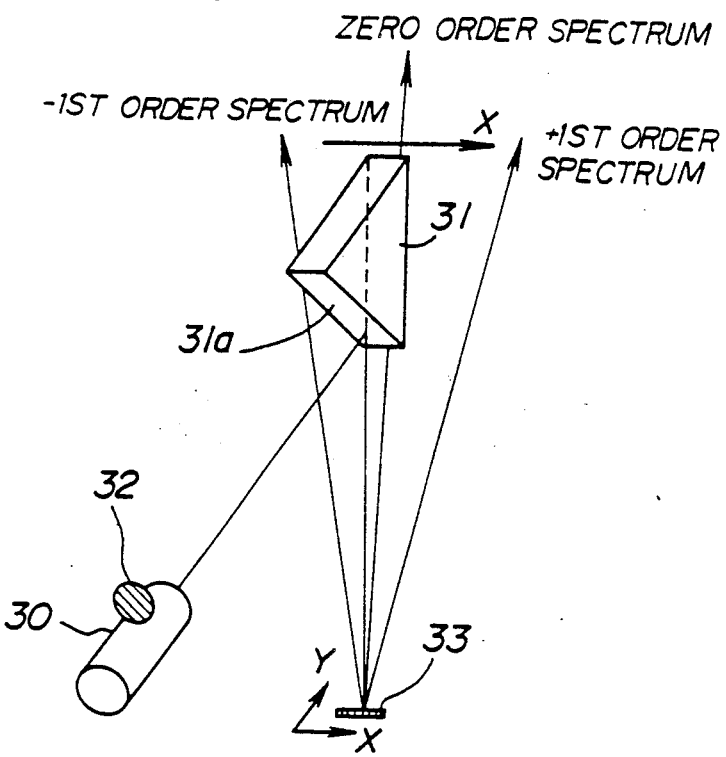
FIGS. 4A and 4B respectively show an essential part of an embodiment of a two-dimensional position detecting apparatus according to the present invention which employs an embodiment of a two-dimensional position detecting method according to the present invention.
Figure 4B:
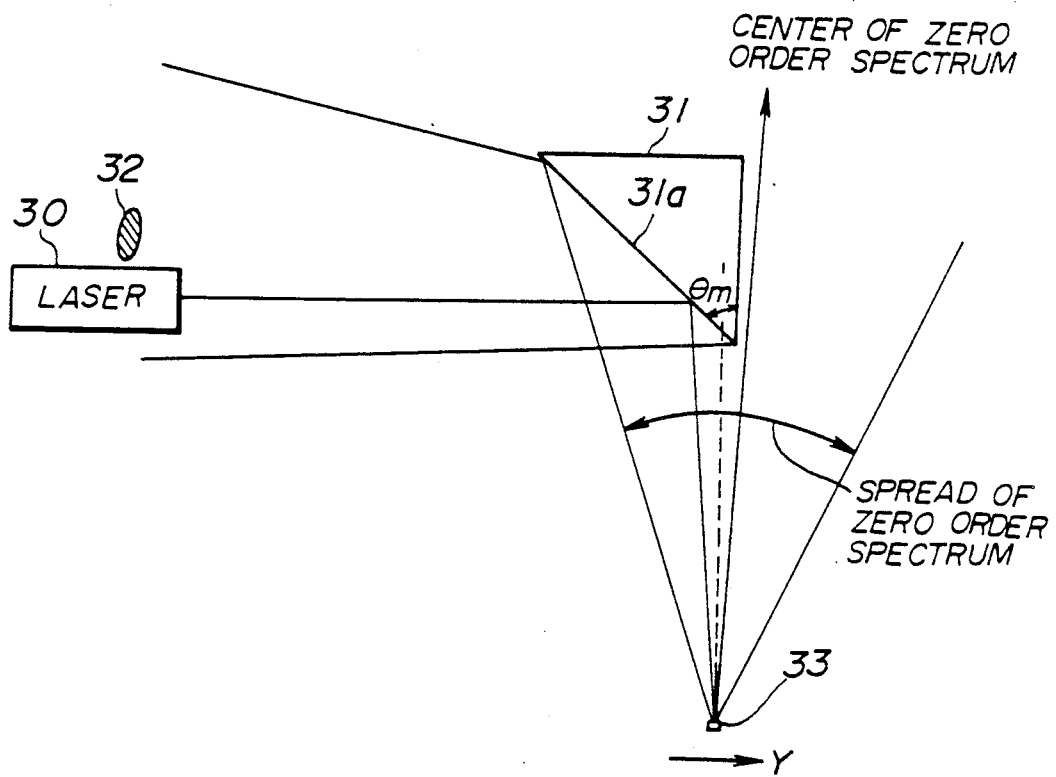

FIGS. 4A and 4B respectively show an essential part of an embodiment of a two-dimensional position detecting apparatus according to the present invention which employs an embodiment of a two-dimensional position detecting method according to the present invention. In FIGS. 4A and 4B, a laser tube 30 emits a laser light in the direction Y which is perpendicular to the direction X in which the gratings of a reflection type diffraction grating 33 extend.

Figure 5:
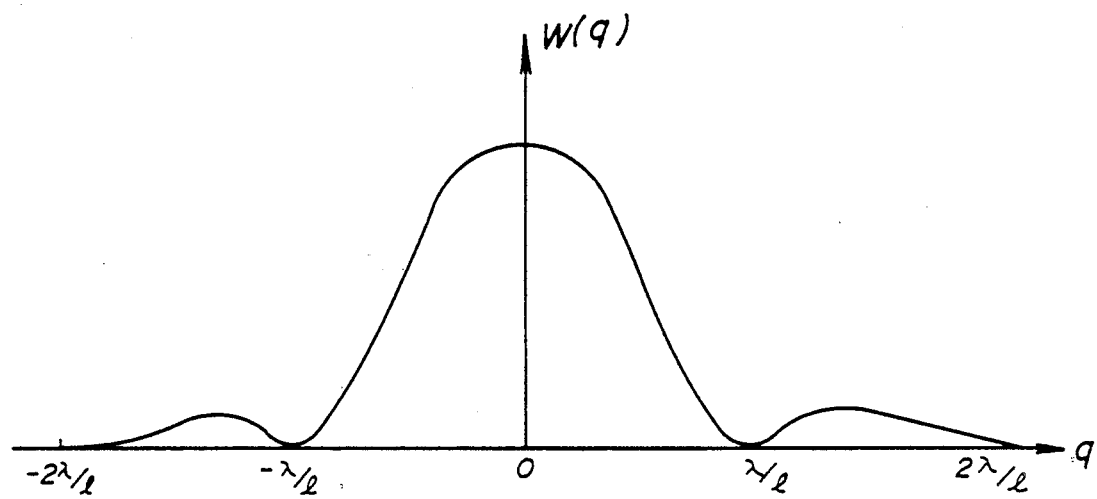
FIG. 5 shows a relationship between a term w(q) and q for explaining the embodiment shown in FIGS. 4A and 4B.

Similarly as described before, an angle $\theta_m$ which is formed between a mirror surface 31a of a mirror 31 and the Z-axis is set so that the zero order spectrum which is constantly generated regardless of the existence of the diffraction grating 33 does not reach a photosensor 32 as a noise. But a laser light which is generated when the laser light from the laser tube 30 is irradiated on the diffraction grating 33 has a finite spread which is defined by the formula (4) as may be seen from FIG. 4B. The spread of the zero order spectrum is given by the term $[\sin(kql/2)/(kql/2)]^2$ of the formula (4). When this term is denoted by w(q), a relationship between the term w(q) and q becomes as shown in FIG. 5.

The relationship w(q)=0 stands when $kql/2 = \pm m\pi$ (m=0, 1, 2, ... ), that is, when $q = \pm m\lambda/l$. It is thus possible to regard $-\lambda/l \leq q \leq \lambda/l$ as being substantially the spread of the zero order spectrum, and this spread can be controlled by varying the length l of each opening of the diffraction grating 33 along the direction $\eta$.

Figure 6:
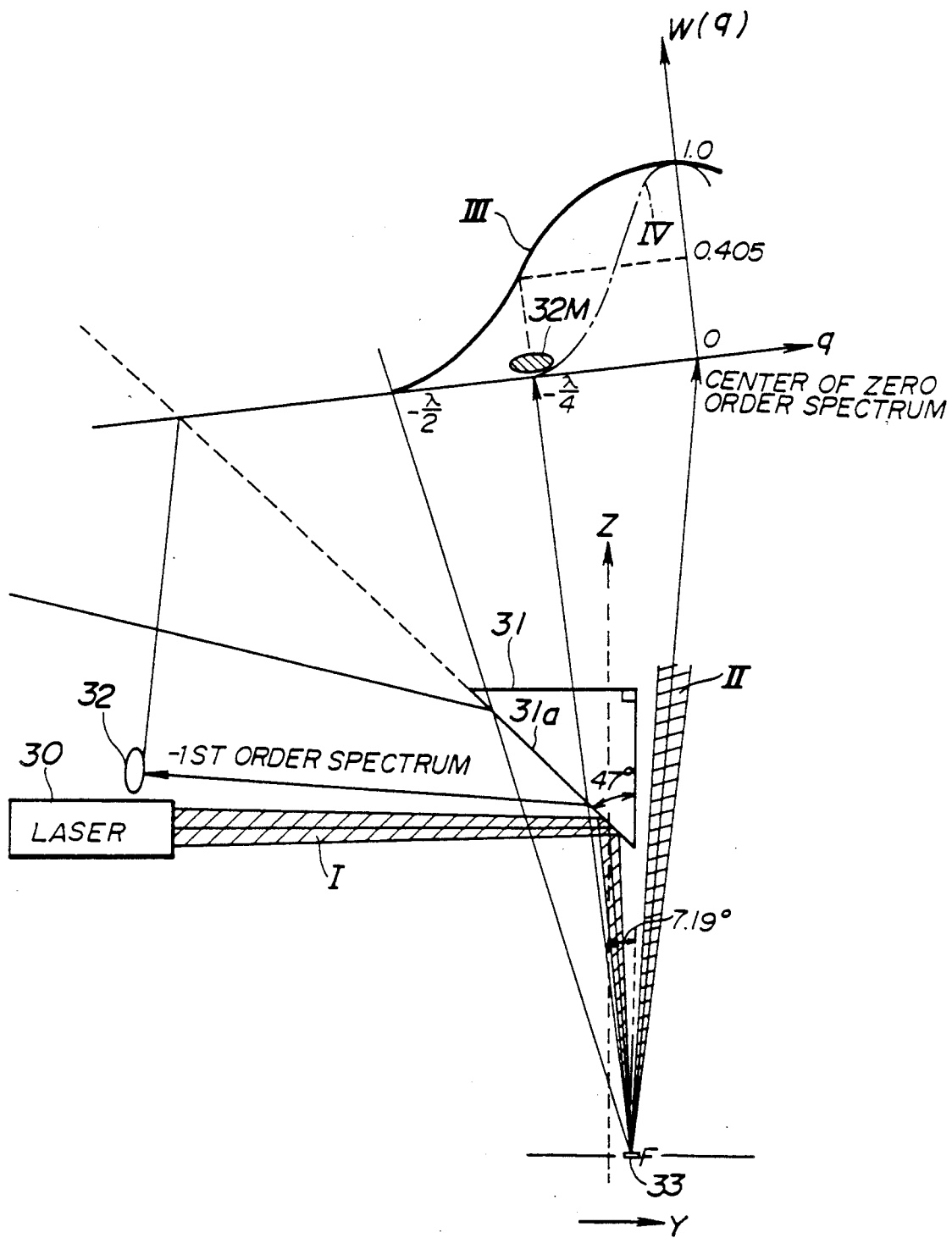
FIG. 6 is a diagram for explaining the embodiment in more detail.

FIG. 6 is a diagram for explaining the embodiment in more detail. In FIG. 6, the laser tube 30 generates a laser light which has a wavelength of 0.78 μm, and this laser light which is indicated by a hatched portion I is emitted via an optical system within the laser tube 30. The laser light emitted from the laser tube 30 is reflected at the mirror surface 31a of the mirror 31 and converges at a focal point F.

The mirror surface 31a of the mirror 31 is inclined 47° to the direction Z so as to prevent the zero order spectrum which is generated when no diffraction grating exists at the point F from reaching the photosensor 32. This zero order spectrum which is generated when no diffraction grating exists at the point F is indicated by a hatched portion II.

Figure 7:
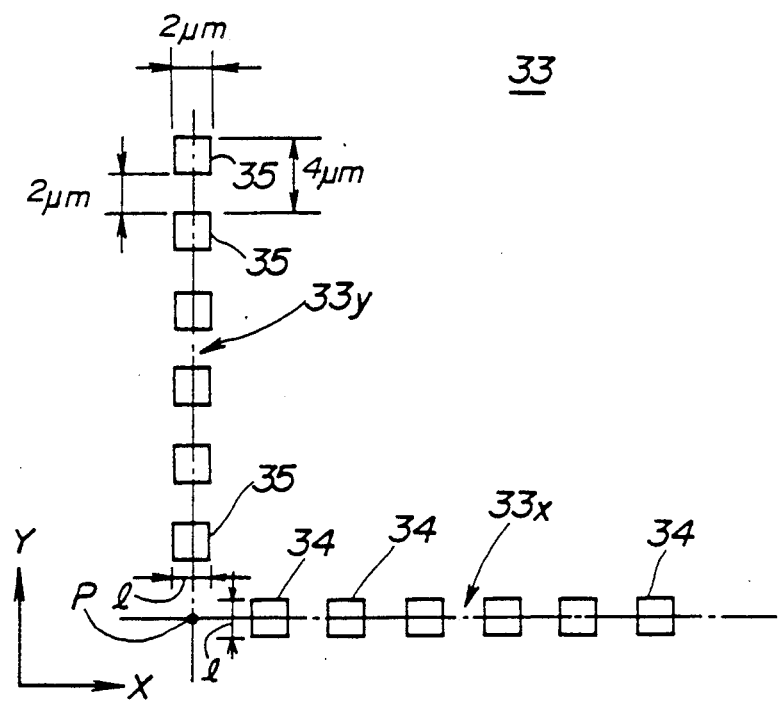
FIG. 7 is a plan view showing a diffraction grating which is used in the embodiment.

The reflection type diffraction grating 33 has gratings arranged as shown in FIG. 7. The diffraction grating 33 comprises a grating portion 33x which is made up of square openings 34, and a grating portion 33y which is made up of square openings 35. The openings 34 and 35 respectively have a side with a length l=2 μm. The openings 34 extend in the direction X with a period of 4 μm, and the openings 35 extend in the direction Y with a period of 4 μm. The grating portions 33x and 33y intersect at a point P.

The photosensor 32 is located at a position in a vicinity of the laser tube 30 so as to receive the −1st order spectrum which is generated when the grating portion 33y coincides with the point F. This −1st order spectrum makes an angle of 7.19° with respect to a line which passes the point F and is parallel to the direction Z.

The X coordinate of the grating portion 33y can be detected by scanning the grating portion 33y at the point F in the direction X under the above described conditions.

Next, the grating portion 33x is scanned in the direction Y. As may be seen from the formula (4), the spread of the zero order spectrum which is generated by the grating portion 33x is $-\lambda/l \leq q \leq \lambda/l$ with respect to the center of the zero order spectrum. But since it is found from the formula (4) that the −1 order spectrum is generated by the grating portion 33y in the direction $q = -\lambda/d$, a relation l < d must be satisfied in order to detect the zero order spectrum which is generated by the grating portion 33x.

In a top portion of FIG. 6 is shown an intensity distribution curve of the zero order spectrum which is generated by the grating portion 33x. 32M denotes an imaginary position of the photosensor 32. This imaginary position 32M is located symmetrically to the photosensor 32 relative to the mirror 31. The intensity distribution curve of the zero order spectrum for the case where l=2 μm as shown in FIG. 7 is indicated by a solid line III, and it is possible to detect approximately 40% of the zero order spectrum at this position of the photosensor 32. For comparison purposes, an intensity distribution curve of the zero order spectrum for the case where l=4 μm is indicated by a one-dot chain line IV, and it is impossible to detect the zero order spectrum at this position of the photosensor 32.

Figure 8A:
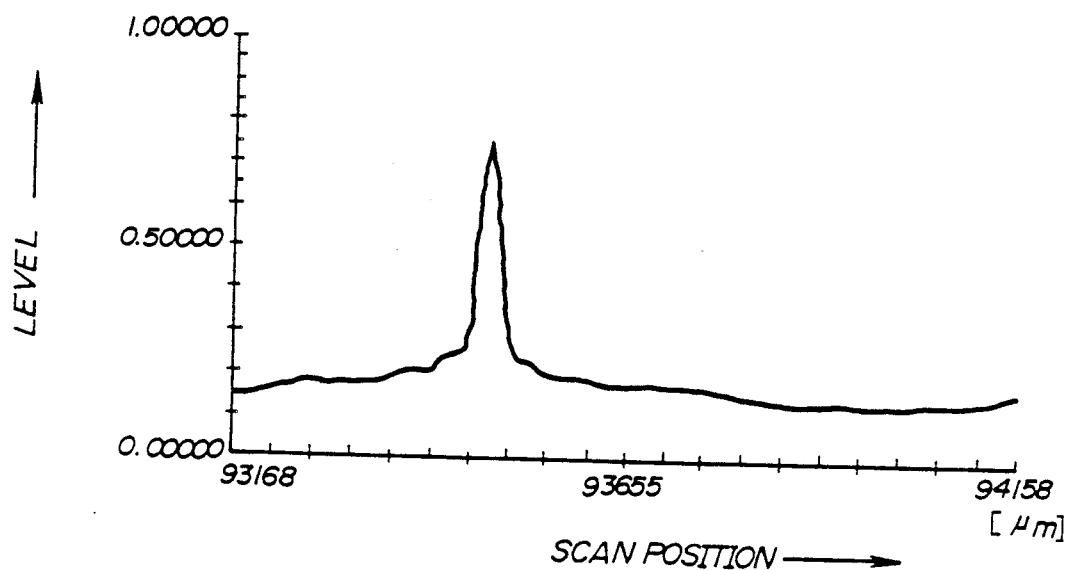
FIGS. 8A and 8B respectively show an output signal of a photosensor in the embodiment.
Figure 8B:
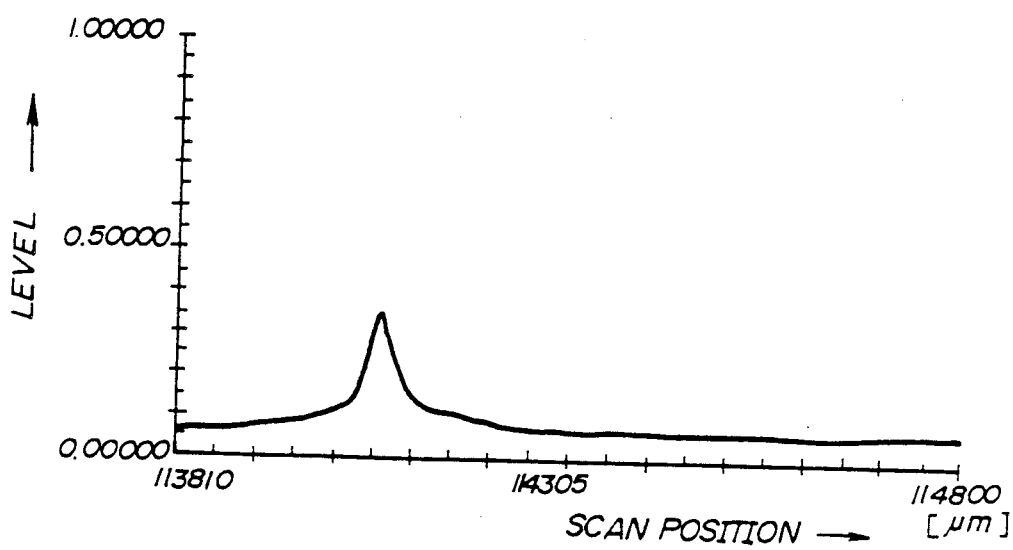

For this reason, when the grating portion 33y of the diffraction grating 33 shown in FIG. 6 is scanned at the point F in the direction X, an output signal of the photosensor 32 changes as shown in FIG. 8A. On the other hand, when the grating portion 33x of the diffraction grating 33 shown in FIG. 6 is scanned at the point F in the direction Y, the output signal of the photosensor 32 changes as shown in FIG. 8B. From the output signal of the photosensor 32 which is obtained during the scans in the directions X and Y, it is possible to detect the position of the diffraction grating 33 in the directions X and Y, that is, the two-dimensional position of the point P of the diffraction grating 33. Hence, this embodiment effectively utilizes the fact that the zero order spectrum spreads only when the laser light scans the diffraction grating 33.

According to this embodiment, it is only necessary to use one laser tube 30, one mirror 31 and one photosensor 32. Hence, the construction of the two-dimensional position detecting apparatus becomes simple. Furthermore, no error is introduced by the arrangement of the apparatus because only one optical system is required to detect the two-dimensional position of one point, thereby making it possible to improve the accuracy of the two-dimensional position detection when detecting the position of the point P which is located at the intersection of the grating portions 33x and 33y.

The arrangement of the gratings of the diffraction grating 33 is of course not limited to that shown in FIG. 7. For example, it is possible to also provide an opening at the intersection of the grating portions 33x and 33y, that is, at the point P. In addition, it is possible to repeat the grating portion 33x in the direction Y and repeat the grating portion 33y in the direction X.

Considering the fact that both the mth (m is an integer) order spectrum which is generated during the scan in the direction X and the zero order spectrum which is generated during the scan in the direction Y are both detected by the same photosensor 32, it is desirable but not essential that the spread of the zero order spectrum is selected to detect approximately the same levels (intensities) at the photosensor 32.

Figure 9:
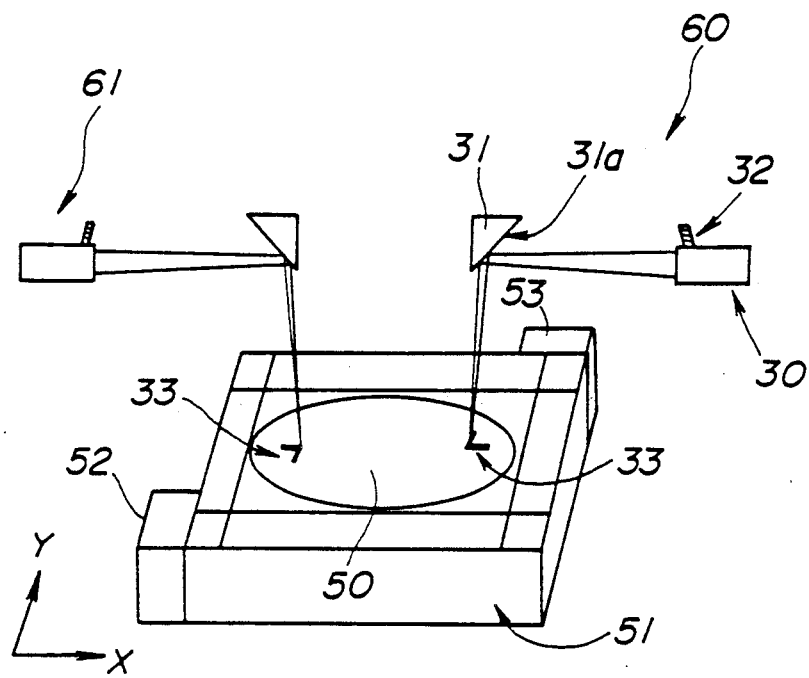
FIG. 9 is a diagram for explaining an embodiment of the two-dimensional position detecting apparatus according to the present invention which is applied to a position detection of a wafer.

Next, a description will be given of an embodiment of the two-dimensional position detecting apparatus according to the present invention which is applied to the position detection of a semiconductor wafer, by referring to FIG. 9. In FIG. 9, a semiconductor wafer 50 is secured on an XY-stage 51 which is movable in the directions X and Y by respective known moving means 52 and 53. The diffraction grating 33 described before is formed on the semiconductor wafer 50 at two locations. Two optical systems 60 and 61 are provided to scan the respective diffraction gratings 33. The two optical systems 60 and 61 have identical structures, and only the constituent elements of the optical system 60 are identified by reference numerals. The optical system 60 generally comprises the laser tube 30, the mirror 31 which has the mirror surface 31a, and the photosensor 32. Although not shown in FIG. 9, there is also provided known means for measuring the moving quantity of the XY-stage 51 in the directions X and Y.

According to the arrangement shown in FIG. 9, it is possible to accurately detect the position of the semiconductor wafer 50 from the results of the two-dimensional position detections made by the two optical systems 60 and 61. When scanning the diffraction grating 33 by the optical system 60 (or 61), it is possible to keep the XY-stage fixed and move the optical system 60 (or 61) or the scanning laser light in the directions X and Y instead of moving the XY-stage 51.

Figure 10:
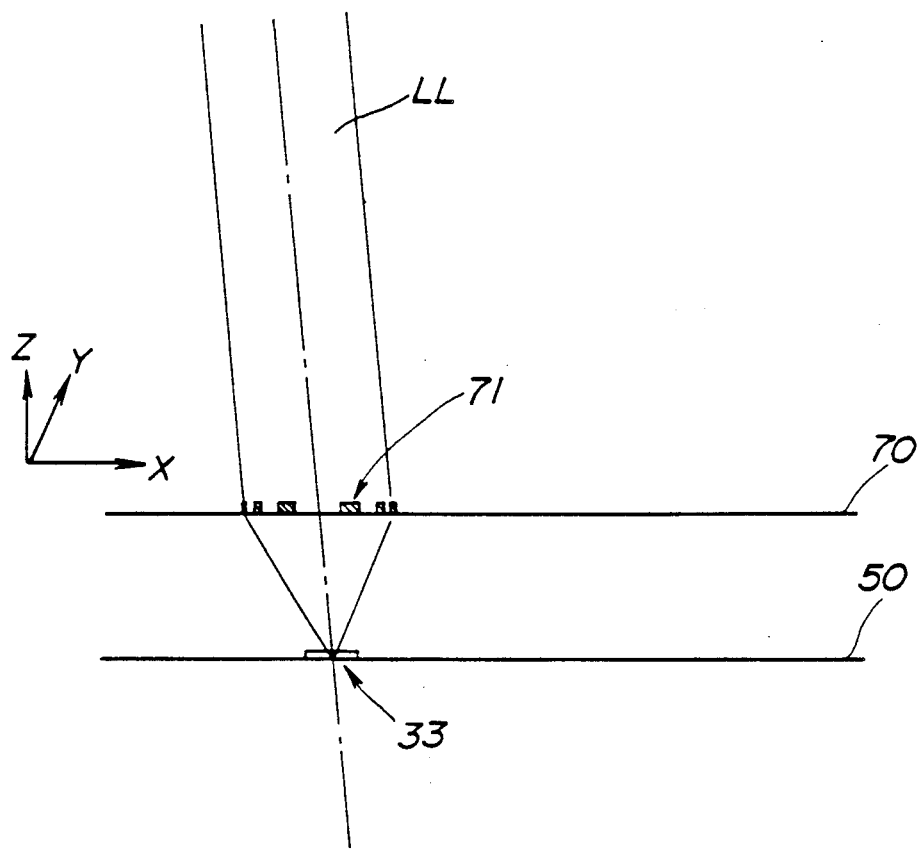
FIG. 10 is a diagram for explaining an embodiment of the two-dimensional position detecting method according to the present invention which is applied to a position detection of a wafer relative to a mask.

Next, a description will be given of an embodiment of the two-dimensional position detecting method according to the present invention which is applied to the position detection of a mask relative to a semiconductor wafer, by referring to FIG. 10. In FIG. 10, a mask 70 is to be positioned in the directions X and Y relative to the semiconductor wafer 50, and this mask 70 has a circular Fresnel zone plate 71. The circular Fresnel zone plate 71 comprises concentric rings which are alternately transparent and nontransparent, and each ring has a radius $r_n(n=1, 2, \ldots)$ such that $r_n^2 = nf\lambda + n^2(\lambda^2/4)$, where f denotes a focal distance of the circular Fresnel zone plate 71 and $\lambda$ denotes the wavelength of a laser light LL. The laser light LL which is emitted from an optical system (not shown) is focused on the diffraction grating 33 of the semiconductor wafer 50 by the circular Fresnel zone plate 71.

Thus, by scanning the diffraction grating 33 with the laser light LL by the relative movement between the laser light LL and the semiconductor wafer 50, it is possible to accurately detect the position of the semiconductor wafer 50 relative to the mask 70. As described before, it is possible to move the semiconductor wafer 50 or the move the optical system or the laser light LL. Of course, the relative positions of the mask 70 and the semiconductor wafer 50 in the direction Z is adjusted by known means prior to positioning the mask 70 in the directions X and Y.

Further, the present invention is not limited to these embodiments, but various variations and modifications may be made without departing from the scope of the present invention.

What is claimed is:

1. A two-dimensional position detecting method for detecting a two-dimensional position of an object which has a diffraction grating provided thereon, said diffraction grating comprising a first grating portion which extends in a first direction and a second grating portion which extends in a second direction which is perpendicular to the first direction, said two-dimensional position detecting method comprising the steps of:

scanning the first grating portion of the diffraction grating in the second direction by a coherent light;

detecting by a photosensor an mth order spectrum which is generated by a diffraction of the coherent light caused by the first grating portion, where m is an integer;

scanning the second grating portion of the diffraction grating in the first direction by the coherent light; and detecting by said photosensor a spread of a zero order spectrum which is generated by a diffraction of the coherent light caused by the second grating portion, thereby detecting the two-dimensional position at an intersection of the first and second grating portions of the diffraction grating.

2. The two-dimensional position detecting method as claimed in claim 1 wherein said step of scanning the first grating portion and said step of scanning the second grating portion use a single laser tube for generating the coherent light.

3. The two-dimensional position detecting method as claimed in claim 1 wherein said step of scanning the first grating portion moves one of the object and the coherent light in the second direction, and said step of scanning the second grating portion moves one of the object and the coherent light in the first direction.

4. The two-dimensional position detecting method as claimed in claim 1 wherein said first and second grating portions respectively comprise square openings which are arranged periodically in the respective first and second directions with a predetermined period, each of said opening having a side which has a length smaller than said predetermined period.

5. The two-dimensional position detecting method as claimed in claim 1 wherein said step of detecting the zero order spectrum utilizes a spread of the zero order spectrum which occurs when scanning the second grating portion in the first direction by the coherent light.

6. The two-dimensional position detecting method as claimed in claim 1 wherein said step of scanning the first grating portion and said step of scanning the second grating portion use a mirror for converging the coherent light on said diffraction grating, said mirror being arranged to direct the mth order spectrum to the photosensor during the scan in the second direction and to direct the spread of the zero order spectrum to the photosensor during the scan in the first direction.

7. The two-dimensional position detecting method as claimed in claim 6 wherein said mirror is arranged to prevent a light at a center of a zero order spectrum which is generated when the coherent light scans a portion of the object with no grating from being directed to the photosensor.

8. The two-dimensional position detecting method as claimed in claim 1 wherein said object is a semiconductor wafer.

9. The two-dimensional position detecting method as claimed in claim 8 wherein said semiconductor wafer is positioned relative to a mask which is provided with a circular Fresnel zone plate thereon, and said step of scanning the first grating portion and said step of scanning the second grating portion use the circular Fresnel zone plate for converging the coherent light on said diffraction grating.

10. A two-dimensional position detecting apparatus for detecting a two-dimensional position of an object which has a diffraction grating provided thereon, said diffraction grating comprising a first grating portion which extends in a first direction and a second grating portion which extends in a second direction which is perpendicular to the first direction, said two-dimensional position detecting apparatus comprising:

a single light source for emitting a coherent light;

converging means for converging the coherent light on the object;

scanning means for generating a relative movement between the coherent light and the object in the first and second directions so as to scan the first grating portion of the diffraction grating in the second direction by the coherent light and scan the second grating portion of the diffraction grating in the first direction by the coherent light; and a single photosensor for detecting an mth order spectrum which is generated by a diffraction of the coherent light caused by the first grating portion during the scan in the second direction and for detecting a spread of a zero order spectrum which is generated by a diffraction of the coherent light caused by the second grating portion during the scan in the first direction, where m is an integer, thereby detecting the two-dimensional position at an intersection of the first and second grating portions of the diffraction grating.

11. The two-dimensional position detecting apparatus as claimed in claim 10 wherein said light source comprises a laser tube for generating the coherent light.

12. The two-dimensional position detecting apparatus as claimed in claim 10 wherein said scanning means comprises means for moving the object in the second direction and means for moving the object in the first direction.

13. The two-dimensional position detecting apparatus as claimed in claim 10 wherein said first and second grating portions respectively comprise square openings which are arranged periodically in the respective first and second directions with a predetermined period, each of said opening having a side which has a length smaller than said predetermined period.

14. The two-dimensional position detecting apparatus as claimed in claim 10 wherein said photosensor is arranged at a position to detect the zero order spectrum which spreads when scanning the second grating portion in the first direction by the coherent light.

15. The two-dimensional position detecting apparatus as claimed in claim 10 wherein said converging means comprises a mirror for converging the coherent light on said object, said mirror being arranged to direct the mth order spectrum to said photosensor during the scan in the second direction and to direct the spread of the zero order spectrum to said photosensor during the scan in the first direction.

16. The two-dimensional position detecting apparatus as claimed in claim 15 wherein said mirror is arranged to prevent a light at a center of a zero order spectrum which is generated when the coherent light scans a portion of the object with no grating from being directed to said photosensor.

17. The two-dimensional position detecting apparatus as claimed in claim 10 wherein said object is a semiconductor wafer.

18. The two-dimensional position detecting apparatus as claimed in claim 17 wherein said semiconductor wafer is positioned relative to a mask which is provided with a circular Fresnel zone plate thereon, said circular Fresnel zone plate converging the coherent light on said diffraction grating when scanning the first and second grating portions.

* * * * *

UNITED STATES PATENT AND TRADEMARK OFFICE
CERTIFICATE OF CORRECTION

PATENT NO. : 4,998,823
DATED : March 12, 1991
INVENTOR(S) : Hironobu KITAJIMA

It is certified that error appears in the above-identified patent and that said Letters Patent is hereby corrected as shown below:

Col. 2, lines 1-10, change formula (2) to insert the missing integrals and thus to read as follows:

$$U(p,q) = C\sum_{n=0}^{N-1} \int_{-1/2}^{1/2}\int_{-s/2}^{s/2} e^{ik[(\xi_n+\xi')p + (\eta n+\eta')q]} d\xi' d\eta' \quad (2)$$

$$= \left[\sum_{n=0}^{N-1} e^{-ik(p\xi n + q\eta n)}\right].$$

$$\left[C\int_{-1/2}^{1/2}\int_{-s/2}^{s/2} e^{-ik(p\xi' + q\eta')} d\xi' d\eta'\right]$$

lines 15-23, change the equation to read as follows:

$$U(p,q) = \sum_{n=0}^{N} e^{-ikpnd} \cdot U_0(p,q)$$

$$= [(1-e^{-iNkpd})/(1-e^{-ikpd})] \cdot U_0(p,q)$$

$$U_0(p,q) = C\int_{-1/2}^{1/2}\int_{-s/2}^{s/2} e^{-ik(p\xi'+q\eta')} d\xi' d\eta'$$

$$= 4C[\sin(kps/2)/(kps/2)] \cdot [\sin(kql/2)/(kql/2)]$$

UNITED STATES PATENT AND TRADEMARK OFFICE
CERTIFICATE OF CORRECTION

PATENT NO. : 4,998,823
DATED : March 12, 1991
INVENTOR(S) : Hironobu KITAJIMA

It is certified that error appears in the above-identified patent and that said Letters Patent is hereby corrected as shown below:

Col. 7, line 20, change "$n^2(\lambda^{2/4})$" to --$\eta^2(\lambda^2/4)$--;
line 33, change "the" (first occurrence) to --to--.

Signed and Sealed this

Seventeenth Day of August, 1993

Attest:

BRUCE LEHMAN

*Attesting Officer*  *Commissioner of Patents and Trademarks*